United States Patent
Menear et al.

(10) Patent No.: US 6,719,142 B1
(45) Date of Patent: Apr. 13, 2004

(54) APPARATUS AND METHOD FOR MEASURING STATIC CHARGE ON WAFERS, DISKS, SUBSTRATES, MASKS, AND FLAT PANEL DISPLAYS

(75) Inventors: John E. Menear, Santa Cruz, CA (US); Lawrence B. Levit, Alamo, CA (US)

(73) Assignee: ION Systems, Inc., Berkeley, CA (US)

(*) Notice: Subject to any disclaimer, the term of this patent is extended or adjusted under 35 U.S.C. 154(b) by 0 days.

(21) Appl. No.: 10/197,085

(22) Filed: Jul. 16, 2002

(51) Int. Cl.[7] .................. B65D 85/00; B65D 85/30; B65D 85/48
(52) U.S. Cl. .................. 206/711; 206/709; 206/710
(58) Field of Search .................. 206/711, 706, 206/709, 712, 710, 701

(56) References Cited

U.S. PATENT DOCUMENTS

| | | | | |
|---|---|---|---|---|
| 5,755,332 A | * | 5/1998 | Holliday et al. | 206/711 |
| 5,833,067 A | * | 11/1998 | Joshi | 206/454 |
| 5,895,191 A | * | 4/1999 | Bonora et al. | 414/217 |
| 6,398,032 B2 | * | 6/2002 | Fosnight et al. | 206/711 |
| 2003/0057130 A1 | * | 3/2003 | Fix et al. | 206/710 |
| 2003/0070960 A1 | * | 4/2003 | Chen et al. | 206/711 |

OTHER PUBLICATIONS

Asyst Technologies, "SMIF–Pod™ 300 mm", Copyright 2002, [online] [Retrieved on Jul. 7, 2002] retrieved from the internet ,URL: http://www.asyst.com/prod/300/300_pod.html>, p. 1.

* cited by examiner

Primary Examiner—Hung V. Ngo
(74) Attorney, Agent, or Firm—Fenwick & West LLP

(57) ABSTRACT

Apparatus and method and system for measuring and controlling electrostatic charge on objects such as semiconductor substrates include a cassette having an inner structure with supporting slots and electrically conductive regions, and having isolated conductive outer walls for supporting objects in the slots, and include a charge monitor connected to the conductive regions and the conductive walls for sensing charge applicable to one or more objects carrying static charge positioned within the cassette. Charge neutralization is controlled in response to sensed charge attaining a selected level.

29 Claims, 4 Drawing Sheets

APPARATUS AND METHOD FOR MEASURING STATIC CHARGE ON WAFERS, DISKS, SUBSTRATES, MASKS, AND FLAT PANEL DISPLAYS

FIELD OF THE INVENTION

This invention relates to methods and apparatus for detecting electrostatic charges on objects such as semiconductor substrates.

BACKGROUND OF THE INVENTION

Semiconductor devices are notoriously sensitive to electrostatic charge that may build up on wafers during processing, and on people and machines that manipulate the wafers during processing. Excessive charge accumulated on a wafer may cause electrostatic discharge through thin layers of insulation, or electro-erode minute conductive patterns on the surface of a wafer with concomitant destruction of circuits formed on the semiconductor wafer. As such circuits progressively increase in complexity and density on semiconductor wafers, the propensity to be destroyed by lower levels of accumulated static charge also increases. Disk drive and flat panel displays and processing masks are comparably sensitive. Additionally, electrostatic charge on a substrate promotes electrostatic attraction of particulate contaminates that adhere to the surface and disrupt the uniformity of subsequent surface deposition processes. Also, discharge of accumulated electrostatic charges on substrates may generate electromagnetic interference signals that can disrupt proper operations of computer-controlled handling and monitoring equipment. Therefore, significant effort must be expended to prevent static charge build-up on isolated semiconductor wafers and other substrates during processing into finished electronic components.

SUMMARY OF THE INVENTION

In accordance with one embodiment of the present invention, an accumulation or stacking of semiconductor wafers or masks into a holding bin or cassette can be monitored for changes in accumulated charge of the stack during insertion or removal of individual wafers within the stack. Standard cassettes for handling multiple wafers through automated loading operations relative to semiconductor processing equipment are modified to provide conductive surfaces that can be connected to charge-measuring meters. In this way, detection of a wafer that includes an excessive accumulation of static charge can be identified and specifically processed to remove the charge and mitigate the prospects of damage to the affected wafer as well as damage to other wafers in the stack. Other wafers or substrates for such devices as flat-panel LCD displays and blanks for hard-disc memory products may be similarly monitored and treated.

DETAILED DESCRIPTION OF THE INVENTION

Figure 1:
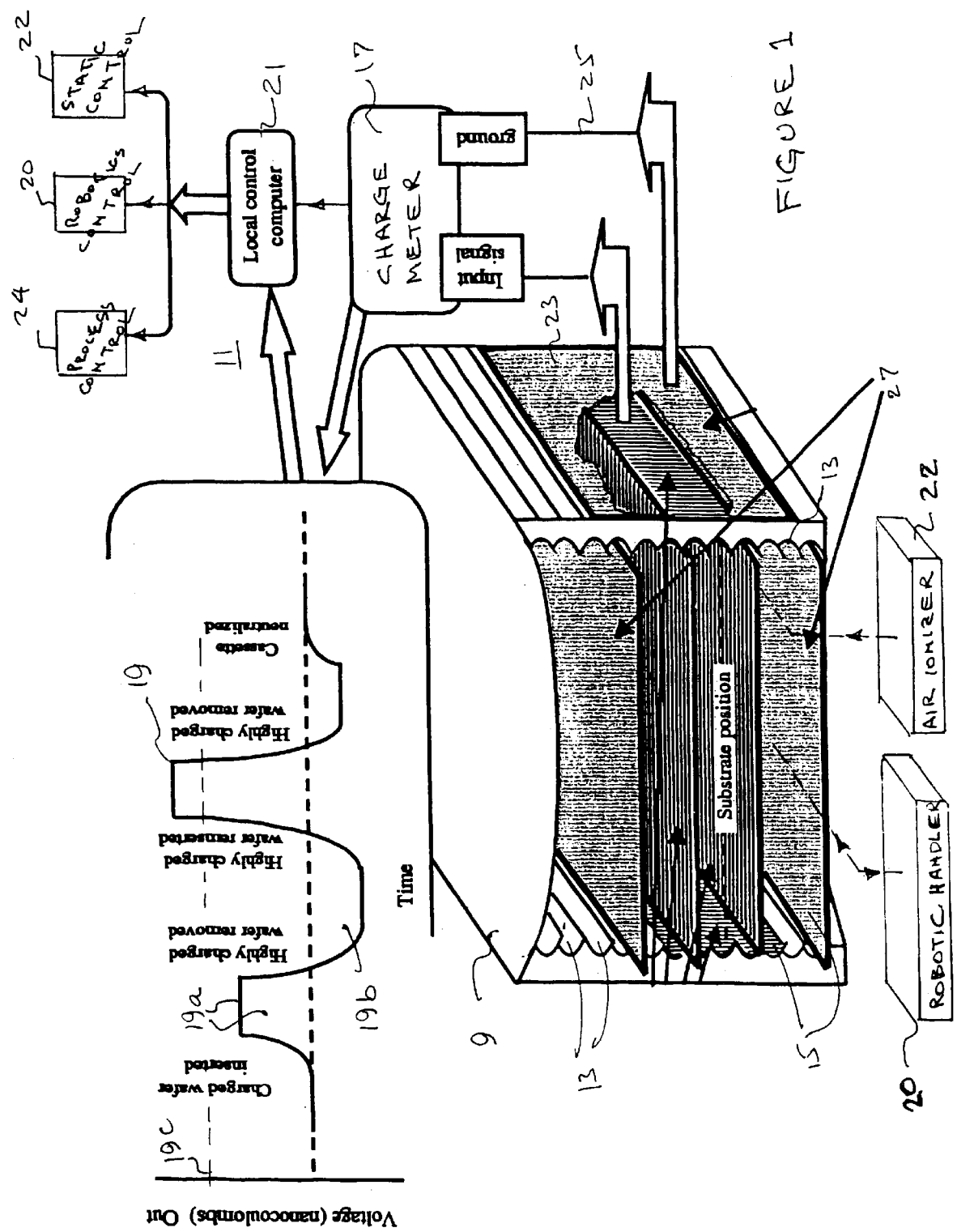
FIG. 1 is a pictorial illustration of one embodiment of a system for monitoring and managing accumulated static charge on semiconductor wafers.

Referring now to FIG. 1, there is shown a partial pictorial illustration of a wafer-storage cassette 9 in association with a charge monitoring and control system 11. The cassette 9 may be configured similarly to industry-standard cassettes for holding about 25 wafers of 8-inch diameter in stacked orientation within individual slots along side edges. Such cassettes are commonly formed of polymer material such as Teflon for conveniently handling batches of wafers through various machine-oriented processes. Wafers thus stacked are accessible through an open front of the cassette 9, for example, for robotic placement and retrieval in conventional manner.

In accordance with the present invention, the inner surfaces of the cassette are coated with a conductive layer 15 or film at least along side edge including supporting grooves 13 and additionally along inner back, top and bottom surfaces. Such conductive layer 15 may include sputtered or plated metal such as aluminum or gold, or may include a conductive polymer film that is applied by spraying or dipping to form an inner isopotential surface 15 within the cassette 9. The outside surface is similarly prepared, and the inside and outside surfaces are electrically isolated. In this configuration, the two conductive layers 15 and 23 on the insulative body 9 of the cassette 9 thus forms a Faraday 'cup' or cage that functions in known manner to indicate net charge on objects disposed therein, and that can be conveniently metered externally for the accumulated or net charge present within the cage.

In accordance with the present invention, the input of a charge meter 17 such as a Monroe Model 284 nanoCoulomb meter or Keithley 6514 meter is connected to the inner isopotential conductive layer 15 and the meter ground is connected to the outside layer 23 for providing indication such as by meter display and/or signal output representative of the net charge that is accumulated on objects (i.e., wafers) disposed within the Faraday 'cup' formed by the conductive layers 15 and 23. Thus, as wafers are inserted into, or retrieved from, different slots in the cassette 9, for example, by robotic handler 20, the net charge within the conductive cage may change, as illustrated in the attached graph 19 of output signal vs. wafer-loading activity over time. Specifically, as a wafer carrying electrostatic charge is inserted into the cassette 9, the charge meter 17 indicates the change in net charge 19a within the cassette 9. Similarly, as a wafer carrying electrostatic charge is removed from the cassette 9, the charge meter 17 indicates the resultant change 19b in net charge within the cassette 9. Thus, identified wafers within specific slots as emptied or filled over the course of a robotic wafer-transferring operation 20 are clearly identified for the charge characteristics associated with each such wafer. Thus, local computer 21 in control of, for example, robotic loading 20 of wafers in designated slots 13 of a cassette 9 can designate each such wafer with its associated charge characteristics for appropriate treatment (e.g., discharged and neutralized by immersion in air ions from air ionizer 22). Alternatively, as a cassette 9 is loaded and monitored for net charge accumulated among the included wafers, a measure of net charge in excess of a selected limit 19c may actuate a mass treatment of all wafers such as by immersion in a stream of air ions from ionizer 22 under control of the computer 21. In this way, wafers undergoing various semiconductor processes 24 may be monitored and treated for electrostatic charge build up at one or more stages of semiconductor processing.

The cassette 9 is coated on the outside surfaces with a layer or film 23 of conductive materials, as on the inside surfaces, but insulated therefrom by the polymer material of the cassette 9, to serve as the ground return or reference 25 for the charge meter 17.

In another embodiment, a standard cassette 9 formed of electrically-insulating material may be equipped with individual conductive plates 27 that are disposed within supporting slots above and below each wafer of a population of wafers in the cassette 9 to serve as isopotential surfaces that are arranged in alternating sequence of a ground plate adjacent a charge-sampling plate adjacent ground plate, and so on, with all charge plates connected together and with all ground plates separately connected together. A charge meter connected between charge-sampling plates and ground plates thus completes the structure that performs as a (partial) Faraday 'cup'.

Figure 2:
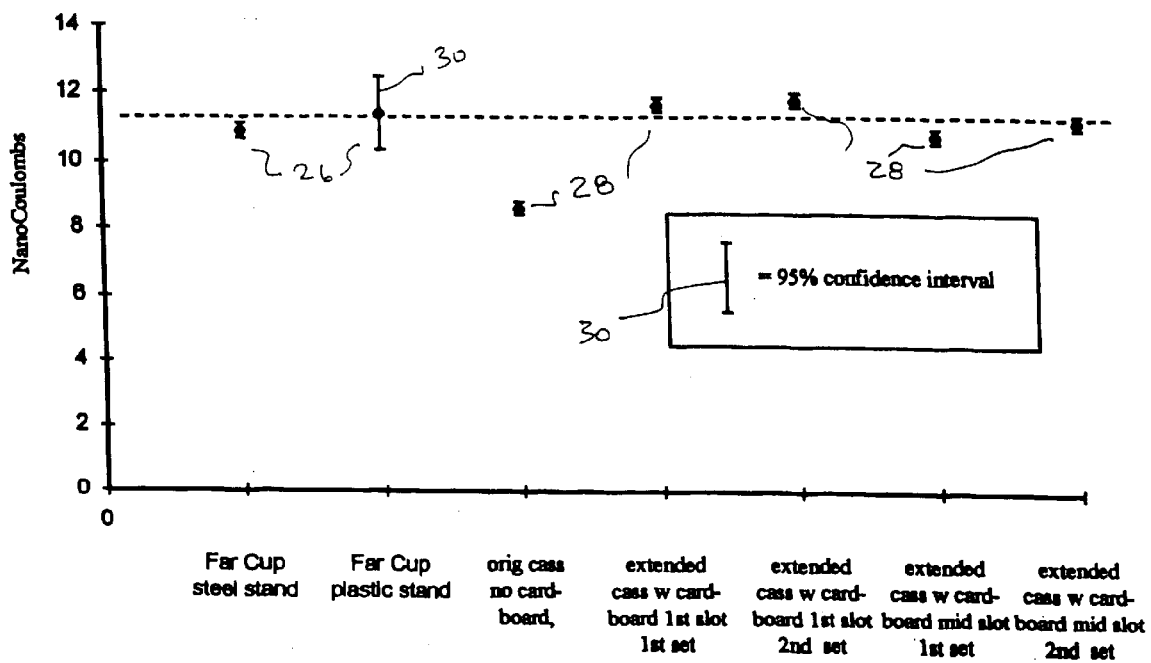
FIG. 2 is a graph illustrating test data on monitored static charge against standard measurement techniques.

Referring now to the graph of FIG. 2, there are shown various plots of charge measurements 26 within standard Faraday 'cups' (traceable for accuracy of measurements back to NIST) relative to plots of charge measurements 28 within various configurations of cassettes according to the present invention. The ranges 30 of charge measurements (in nanoCoulombs) per configuration represent measurements within about 95% level of accuracy from 20 measurements performed on each Faraday 'cup' and cassette configuration. This data supports reliance upon the cassettes 9 of the present invention to perform as standard Faraday 'cups' with high degrees of accuracy and repeatability suitable for operation within computer-controlled automated processes on semiconductor wafers. Alternatively, with reference to the graph of FIG. 3, inaccuracies in responsiveness 32 of cassette 9 configured according to the present invention to the monitoring of net charge on wafers positioned therein may be individually identified and calibrated to establish look-up table corrections, storable in computer 21, for each cassette 9 to assure more accurate monitoring of net charge indications within that cassette as provided by charge meter 17.

Figure 3:
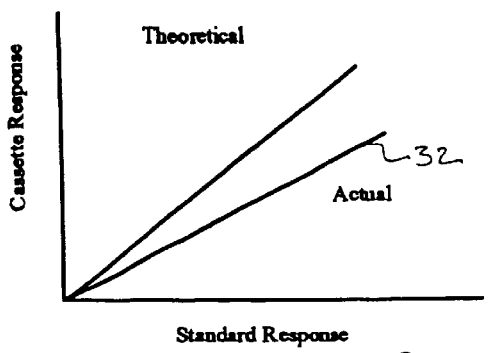
FIG. 3 is a graph illustrating measurement characteristics of a wafer cassette in accordance with the present invention.
Figure 4:
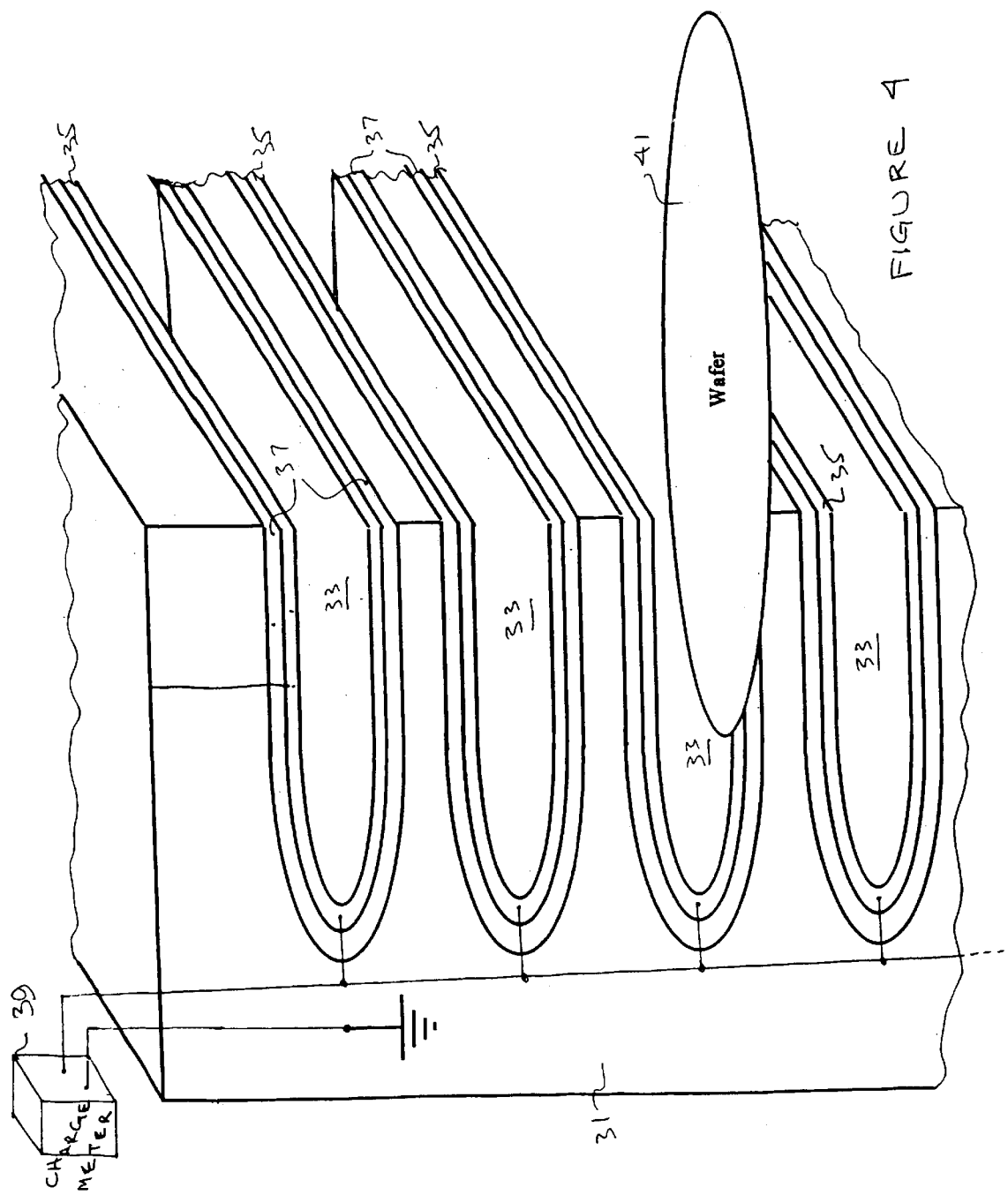
FIG. 4 is a partial pictorial view of another embodiment of a wafer cassette in accordance with the present invention.

Referring now to FIG. 4, there is shown a partial pictorial view of another cassette 31 for operation in monitoring net charge on wafers positioned in the cassette. In this embodiment, the cassette 31 includes a body of conductive material (e.g., metal or conductive polymer) including a plurality of wafer-receiving slots 33 at regular spacing intervals throughout the body. Each slot 33 includes an inner conductive layer 35 of conductive material (i.e., metal or conductive polymer) and an insulating layer 37 interposed between the conductive body 31 and the conductive inner layer 35. In this configuration, a wafer 41 positioned within a slot 33 and carrying electrostatic charge may be monitored for level of charge by the charge meter 39 that is connected between the inner layers 35 and the conductive body 31 as a ground or reference for the charge meter 39. Higher or closer correlation between theoretical response to such electrostatic charge, as may be determined via a Faraday 'cup', and the typical responses, as illustrated in FIG. 3, attained in such configuration of cassette thus provide highly accurate or predictable and repeatable indications of charge on each wafer 41 inserted into or removed from a slot 33 as a result of monitoring overall net charge contained within the slots 33. And, changes in net charge, as indicated in the output of charge mater 39 (e.g. 19a, 19b as shown in FIG. 1) in response to insertion or removal of a wafer 41 from a slot 33 provide indication of charge characteristics associated with the specific wafer. For wide variations in net charge per change of wafer, the controlling computer (e.g. 21 of FIG. 1) may implement charge neutralization procedures, for example, using a flowing stream of air ions from ionizer 22 directed over wafers 41 in the cassette.

Figure 5:
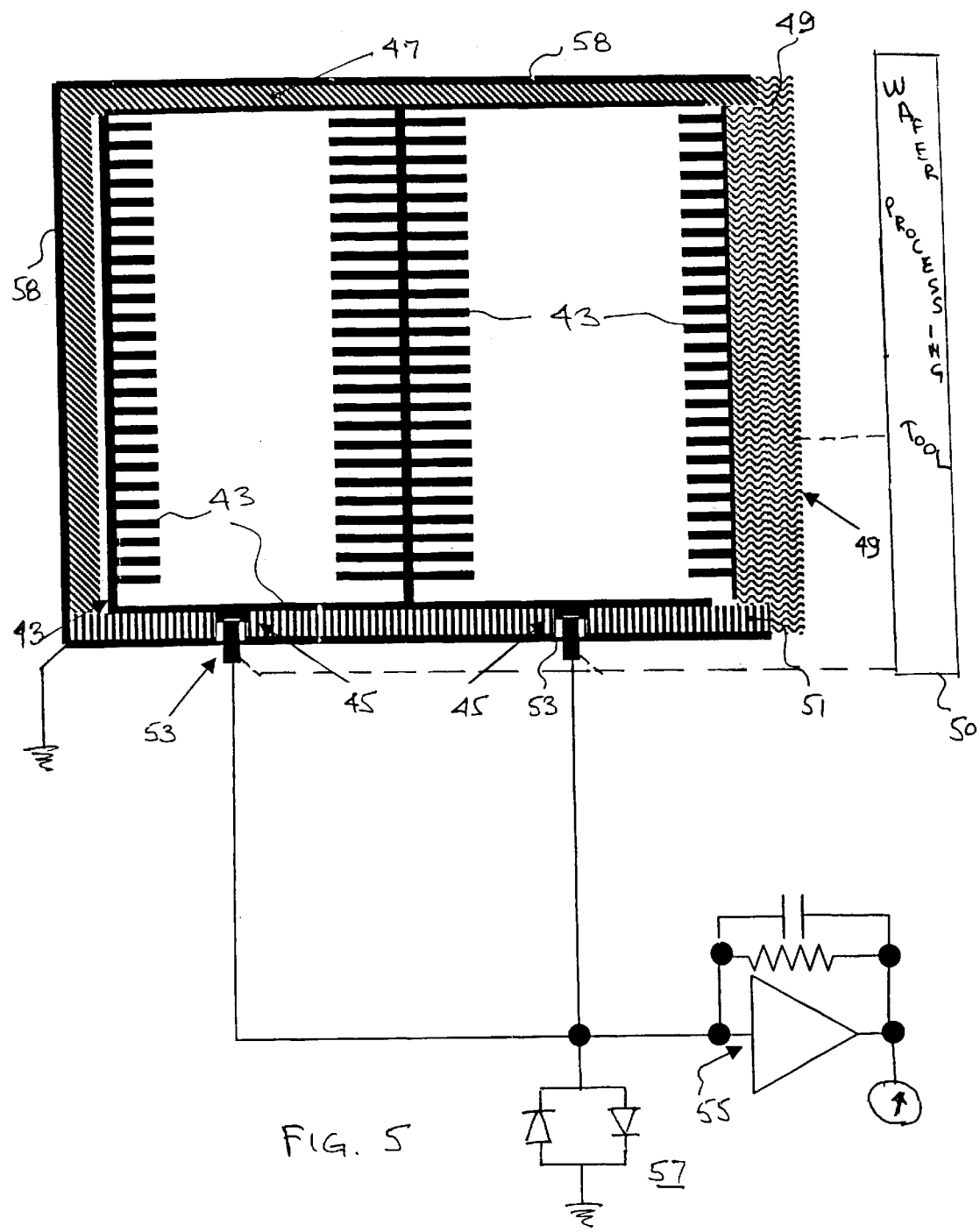
FIG. 5 is a pictorial cutaway side-view illustration of an industry-standard front-opening unitized pod and system for holding and handling large semiconductor wafers, modified in accordance with another embodiment of the present invention.

Referring now to FIG. 5, there is shown a cutaway pictorial side view of an industry-standard Front-Opening Unified Pod (FOUP) that is suitable for handling a plurality of 300 mm semiconductor wafers through robotic wafer-handling fabrication processes. An interior structure 43 includes a plurality of wafer slots in one or more sets or stacks within a cabinet-like frame that is formed of conductive polymer material (e.g., polycarbonate with carbon-particles filler) to support a wafer in each slot. The interior structure 43 is disposed to connect electrically to kinematic pins 45 when the FOUP is loaded into the mating port of a wafer processing tool 50 (as pictorially illustrated herein). The interior frame 43 is mounted within an exterior housing of insulating material 47 that includes a front panel 49 which is removable for wafer-transferring operations, and that is supported on an insulating base platen 51 which receives the kinematic pins 45 in mating recesses 53 to provide secure, repeatable registration of the FOUP with the wafer processing tool 50.

In accordance with this embodiment of the present invention, the outer surface of the insulative exterior housing 47 is coated or surrounded with a conductive material 58 on top and back and opposite ends for grounding, and the interior conductive frame 43 is electrically connected, in one embodiment, to the kinematic pins 45 when the FOUP is installed in the wafer-processing tool 50. Specifically, in accordance with this embodiment, each of the kinematic pins 45 of the wafer-processing tool 50 is modified from conventional configuration to include an electrically-insulated conductive segment which is disposed to contact the conductive interior frame 43 and which is otherwise electrically isolated and connected to an input of a charge meter 55, for example, of the type previously described herein. In this configuration, the FOUP is capable of storing substrates within the interior frame 43, and is also capable of serving as a partial Faraday cup. Thus, measuring the current drawn through the kinematic pins 45 as a substrate is being transferred to or from the FOUP, is a measurement indication of the charge on the substrate. Such measurement indication may be slowed or integrated by the [DC] RC time constant of the system (e.g., 50 msec. to several seconds), and the measurement of charge can be achieved using the charge meter 55 operating, for example, with an operational amplifier connected to provide a virtual-ground input. The input to the charge meter 55 may be shunted by a pair of diodes 57 parallel connected in conduction opposition, and the kinematic pins 45 will be effectively grounded independently of the powered state of the charge meter 55 to substantially satisfy the specific industry requirements for grounded kinematic pins for proper operation of a FOUP in the loading port of the wafer-handling tool 50. Alternatively, current may be taken from the conductive frame 43, that is electrically isolated from the kinematic pins 45 to thereby obviate the need for modifications to the wafer processing tool 50.

Therefore, the method and apparatus of the present invention facilitates rapid and accurate assessment of net charge accumulated on a population of objects such as semiconductor wafers contained within a cassette. Transitions of wafers into or out of the cassette provide indication of the charge characteristics associated with each such wafer for enhanced control of required electrostatic discharge procedures.

What is claimed is:

1. Apparatus for monitoring electrostatic charge, comprising:
    a housing including space therein for supporting a number of objects, one or more of which may carry electrostatic charge;
    a conductive structure within the housing adjacent the number of objects supported within the housing;
    a conductive layer outside of the housing electrically insulated from the conductive structure within the housing; and
    a charge meter connected to the conductive structure within the housing and to the conductive layer outside of the housing for monitoring electrostatic charge on the number of objects supported within the housing.

2. Apparatus as in claim 1 in which the housing is formed of electrically insulating material and includes side walls having a plurality of slots therein in aligned array for supporting substantially planar wafers within pairs of corresponding slots in substantially plane-parallel orientations; and
    the conductive structure within the housing includes a conductive layer that extends within the slots in the side walls.

3. Apparatus as in claim 1 in which the housing is formed of electrically insulating material to substantially enclose the conductive structure therein; and
    the conductive layer is disposed on surfaces of the housing that are electrically insulated from the conductive structure.

4. Apparatus according to claim 1 in which the housing is formed of conductive material and includes a number of pairs of slots in inner side walls of the housing for supporting an object in each of a pair of corresponding slots;
    each of the slots including an insulating layer interposed between the body and a conductive layer; and
    the charge meter is connected between the conductive layers within each slot and the conductive body.

5. Apparatus as in claim 1 including a processor in signal communication with the charge meter for providing selected responses to changes in charge meter indications of charge in response to transfer of an object relative to the housing.

6. Apparatus according to claim 5 in which the processor is responsive to an indication from the charge meter of a change in charge within the housing upon transfer of an object relative to the housing to control charge neutralization at least of the transferred object.

7. Apparatus according to claim 6 in which charge neutralization is controlled with respect to objects contained within the housing in response to a selected indication by the charge meter of charge on objects within the housing.

8. Apparatus according to claim 7 in which charge neutralization includes supplying a flow of air ions to objects within the housing.

9. A method for sensing electrostatic charge on an object that is transferred with respect to a housing, the method comprising:
    establishing near the object within the housing a conductive structure that is electrically isolated;
    transferring relative to the housing an object that may carry electrostatic charge thereon; and
    monitoring charge on the conductive structure at least during transfer of the object relative to the housing.

10. The method of claim 9 in which monitoring includes sensing electrostatic charge on the conductive structure; and
    controlling neutralization of electrostatic charge at least on the transferred object in response to a selected change in the sensed electrostatic charge.

11. The method according to claim 10 in which the neutralization includes supplying air ions to objects within the housing.

12. The method according to claim 11 in which neutralization of electrostatic charge on objects within the housing is performed in response to monitored charge attaining a selected level.

13. A system for handling a population of objects that may carry electrostatic charge, the system comprising:
    a housing for supporting therein a number of the objects from the population thereof, the housing including a conductive structure near the number of objects insulated from ground;
    transfer apparatus for selectively transferring the number of objects relative to the housing; and
    a monitor in electrical communication with the conductive structure for monitoring charge appearing on the conductive structure at least during transfer of an object relative to the housing.

14. The system according to claim 13 including an electrostatic control module disposed to neutralize electrostatic charge at least on the object transferred relative to the housing in response to a condition of charge on the conductive structure sensed by the monitor.

15. The system according to claim 14 in which the conductive structure includes a plurality of oppositely-paired slots in inner walls for supporting a plurality of planar wafers therein in substantially aligned orientations; and
    the module is disposed to supply a flow of air ions to the conductive structure for neutralizing charge on wafers positioned therein.

16. The system according to claim 13 in which the housing includes an inner conductive structure for supporting the objects therein and an outer housing supporting an electrically conductive layer thereon electrically insulated from the conductive structure; and
    the monitor is electrically connected to the inner conductive structure and the conductive layer for monitoring charge appearing on the conductive structure.

17. The system according to claim 16 in which electrical connection of the monitor includes registration pins mounted in electrical isolation on an object-handling tool to align with corresponding recesses in a wall of the housing and to electrically connect the monitor with the conductive structure in response to the registration pins aligned within the corresponding recesses.

18. The system according to claim 17 in which the registration pins include electrically isolated segments, with one of such segments disposed to electrically connect with the conductive structure and the monitor.

19. The system according to claim 16 in which the monitor is electrically connected to the inner conductive structure in response to positional registration of the housing with respect to the transfer apparatus.

20. Apparatus for containing a plurality of wafers, one or more of which may carry electrostatic charge, the apparatus comprising:
    a housing having side supports including a plurality of slots disposed in oppositely-aligned pairs for containing a wafer in each such pair of slots within the housing;

a conductive surface at least in selected slots for electrically communicating with a wafer disposed therein; and an electrical connection to the conductive surface in at least one slot of each of the pair of slots in the housing in electrical isolation from other paths of electrical conduction.

21. Apparatus according to claim 20 in which the housing includes electrically non-conductive material; and the conductive surface includes a layer of conductive material thereon within each of the slots.

22. Apparatus as in claim 20 including a layer of conductive material disposed in spaced orientation relative to a pair of slots for forming a substantially isopotential surface that is near a wafer positioned in such pair of slots and that is in electrical communication with the electrical connection.

23. Apparatus according to claim 21 in which the housing includes a layer of conductive material disposed about an outer surface of the housing electrically insulated from the layer of conductive material within the slots; and includes an electrical connection to the conductive layer disposed about the outer surface.

24. Apparatus according to claim 21 in which the housing is formed of conductive material and includes a layer of insulation disposed between the conductive surface in each slot and the conductive material of the housing, and includes an electrical connection to the conductive material of the housing electrically isolated from the conductive surface in the slots.

25. Apparatus according to claim 21 including a conductive layer disposed within a pair of slots to form an isopotential surface near to and spaced away from a wafer positioned in a pair of the slots.

26. Apparatus according to claim 20 in which the housing and conductive surface are comprised of a conductive structure substantially enclosed within a conductive surface that is electrically isolated from the conductive structure; and the electrical connection to the conductive structure is electrically isolated from the conductive surface.

27. Apparatus according to claim 26 including an outer housing substantially enclosing the conductive structure and forming the conductive surface in electrical isolation from the conductive structure.

28. Apparatus for containing a plurality of substrates, one or more of which may carry electrostatic charge, the apparatus comprising:

a housing of insulative material having side supports including a plurality of slots disposed in oppositely-aligned pairs for containing a substrate in each such pair of slots within the housing;

conductive layers disposed in said housing on opposite sides of slots for containing a substrate to form electrically isolated isopotential surfaces near to and spaced away from a substrate positioned in a pair of the slots within the housing; and electrical connections to the conductive layers for sensing electrostatic charge on a substrate positioned between the conductive layers.

29. Apparatus according to claim 28 in which the housing is configured to support therein a plurality of one of the group of components consisting of semiconductor wafers, semiconductor masks, disk-drive substrates, and flat-panel displays.

* * * * *